July 11, 1967 G. B. BAY ETAL 3,331,028

MULTISTAGE TRANSISTOR AMPLIFIER IN WHICH THE IMPEDANCES OF THE VARIOUS STAGES ARE SUCCESSIVELY VARIED TO CONTROL GAIN

Filed Jan. 21, 1965

INVENTORS.
GERALD B. BAY
LAUGHTON T. FINE
BY Alden D. Redfield
Irwin P. Garfinkle
ATTORNEYS.

United States Patent Office 3,331,028
Patented July 11, 1967

3,331,028
MULTISTAGE TRANSISTOR AMPLIFIER IN WHICH THE IMPEDANCES OF THE VARIOUS STAGES ARE SUCCESSIVELY VARIED TO CONTROL GAIN

Gerald B. Bay and Laughton T. Fine, Cincinnati, Ohio, assignors to Avco Corporation, Cincinnati, Ohio, a corporation of Delaware Filed Jan. 21, 1965, Ser. No. 426,957
14 Claims. (Cl. 330—24)

ABSTRACT OF THE DISCLOSURE

The gain of an alternating current multistage transistor amplifier is controlled over a wide dynamic range with low modulation distortion and good gain stability by sequentially varying the alternating current load lines on the amplifier stages while maintaining a constant direct current quiescent operating point. Initially the emitters of the first two stages are near alternating current ground while high impedance alternating current loads are provided for the collector. The impedance in the emitter circuit of the second stage is first increased to a maximum until the gain control voltage reaches a given value. Then the emitter impedance of the first stage is increased to a maximum until the gain control voltage reaches a second level. Thereafter the collector load of the second stage is reduced to a minimum. The impedances of the various emitters and collectors are controlled by biased diodes.

This invention relates to an automatic gain control system for an alternating current signal amplifier, and more particularly to an automatic gain control system for a multistage amplifier in which control of the various stages is sequentially effective for the purpose of maintaining a relatively constant output level over a wide range of input levels.

The prior art is replete with many electronic systems for automatic gain control. The most common gain control system involves the variation of the quiescent direct current operating point, or the direct current load line, or both. This method, as well as others in the prior art, give rise to severe distortion at high signal input levels, and, in addition, renders the circuit unstable with respect to temperature and transistor variations.

The present invention achieves a wide dynamic range with low modulation distortion and good gain stability. Briefly stated, this invention utilizes several transistor amplifier stages, the gains of which are controlled by a conventional source of automatic gain control which may vary, for example, between +8.5 volts for maximum gain to −3.5 volts for minimum gain. Gain control is obtained with minimum modulation distortion by sequentially varying the alternating current load lines on the amplifier stages while maintaining a constant direct current quiescent operating point.

This is accomplished by taking advantage of the fact that the gain of a common emitter amplifier is approximately equal to the ratio between the alternating current collector impedance and the alternating current emitter impedance; that is, a stage with a high impedance collector load and a low impedance in the emitter will have high gain, and conversely, a stage with a low impedance collector load and a high impedance in the emitter will have high attenuation. Low modulation distortion at high input levels results because of the use of a high impedance in the emitter of the amplifier stages, thereby keeping the alternating current swing less than the quiescent direct currents. Initially, each of the emitters in the first two stages of the amplifier are near alternating current ground while there are high impedance collector loads. By means of a unique arrangement of biased diodes, these impedances are automatically and sequentially varied; that is, the impedance in the emitter circuit of the second stage is increased to a maximum value as the automatic gain control voltage decreases to a given value. Then the emitter impedance of the first stage begins to increase to a maximum value until the gain control voltage reaches zero, and thereafter when the automatic gain control voltage goes negative, the collector load of the second stage is reduced to a maximum value. There is produced, therefore, a sequential control of the alternating current load of the first two stages in the amplifier resulting in a high degree of control with minimum modulation distortion.

It is an object of this invention to provide an electronic amplifier capable of amplifying alternating current signals while controlling the gain of the amplifier as part of a servo loop gain control system.

Another object of this invention is to control the gain of a multistage amplifier by sequentially controlling the alternating current impedances in selected stages of the amplifier.

Another object of this invention is to provide an alternating current multistage amplifier in which the gain is controlled by first regulating the alternating current impedances of one stage with automatic gain control voltage developed from signals between certain levels and the alternating current impedances of a prior stage with automatic gain control voltages developed from signals between higher levels.

Still another object of this invention is to provide a transistorized two-stage amplifier in which the gain is controlled by first increasing the alternating current emitter impedance of the second stage transistor, then increasing the alternating current emitter impedance of the first stage transistor, and then decreasing the alternating current collector impedance of the second transistor.

For further objects and a better understanding of this invention, reference should now be made to the following detailed specification along with the accompanying drawing in which.

Figures 1, 2, 3:
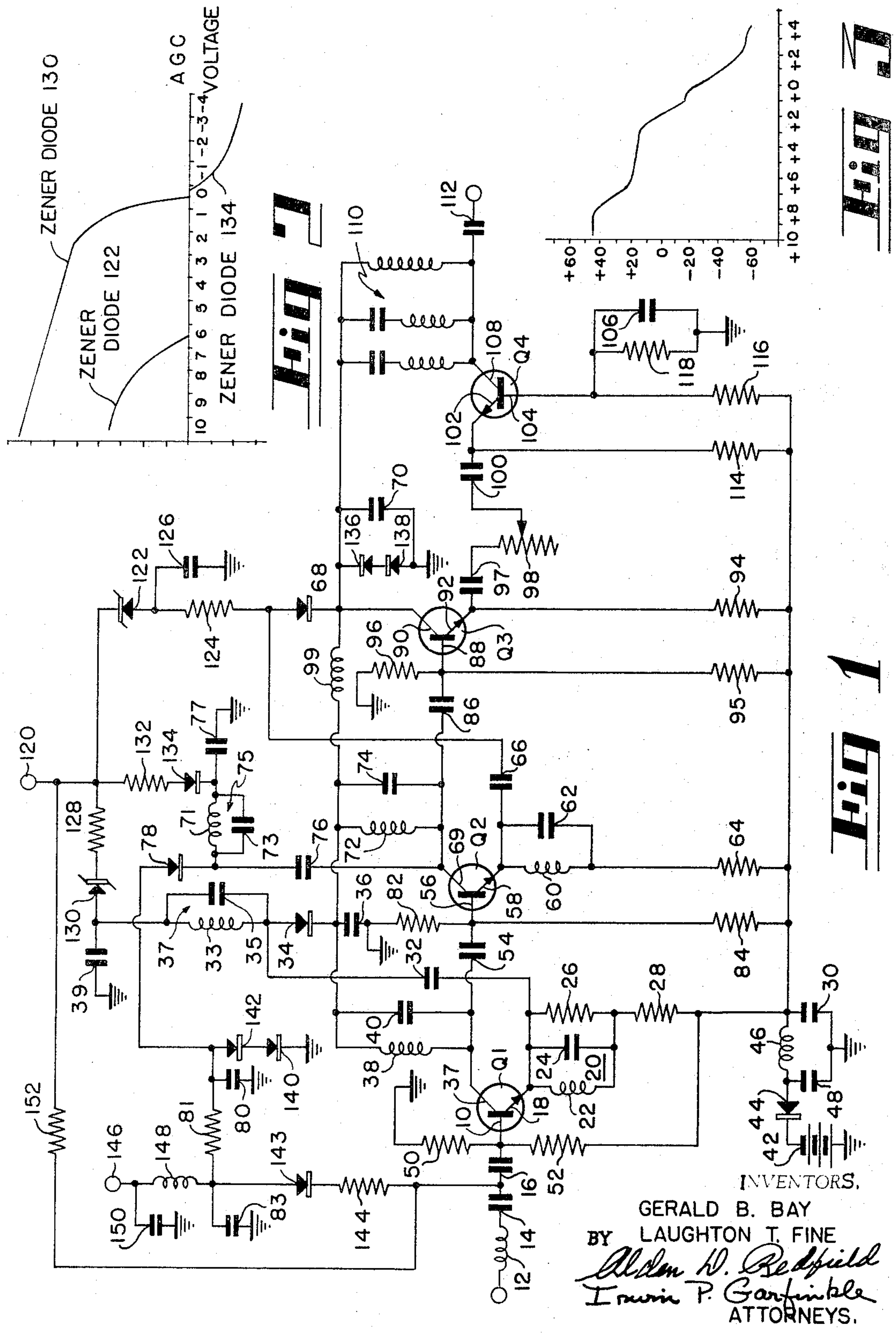
FIGURE 1 is a schematic diagram representing a preferred embodiment of this invention.
FIGURE 2 is a curve showing the operating characteristics of the zener diodes in the system.
FIGURE 3 is a curve showing the over-all gain characteristics of the system.

The multistage alternating current amplifier illustrated in FIGURE 1 comprises four stages, each including an NPN-type transistor Q1, Q2, Q3, and Q4. The automatic gain control system taught by this invention is exercised in the first two stages.

Alternating current signals are applied to the base 10 of transistor Q1 through an inductor 12 and capacitors 14 and 16. The emitter 18 of transistor Q1 is connected to ground for alternating currents in two parallel path:. one through a parallel tank 20 consisting of an inductor 22, a capacitor 24, and a resistor 26, and through a resistor 28 and a capacitor 30; and the second through a capacitor 32, a diode 34, and a capacitor 36. A tank 37, including an inductor 33 and a capacitor 35, and a capacitor 39 are in parallel with the diode 34 and with tank 20.

Normally, the diode 34 is maintained forward biased, in a manner hereinafter to be described, so that the second path (the diode 34) constitutes a very low impedance shunt across the first path, thereby initially establishing a very low emitter load for the transistor Q1.

The alternating current load for collector 37 of transistor Q1 is a resonant parallel tank including an inductor 38 and a capacitor 40. Direct current bias for the transistor Q1 is supplied from a battery 42 through a diode 44 and a decoupling filter including a choke 46, a capacitor 48, and capacitor 30. The direct current bias is connected across voltage-dividing resistors 50 and 52.

The collector output of transistor Q1 is applied through a capacitor 54 to the base 56 of transistor Q2. The emitter 58 of transistor Q2 is also connected to ground for alternating currents through two parallel paths. The first path is through a resonant tank including an inductor 60 and a capacitor 62, and through a resistor 64 and the capacitor 30, and through capacitor 66, resistor 124, and capacitor 126. The second alternating current path to ground is through capacitor 66, diode 68, and a capacitor 70. Diode 68 is also initially forward biased so that the second path constitutes an alternating current low impedance shunt across the first path, thereby initially establishing maximum gain.

The alternating current load for collector 69 of transistor Q2 is a resonant tank including an inductor 72 and a capacitor 74. In addition, the collector load includes a resonant tank 75, including an inductor 71 and a capacitor 73, connected between the collector 69 and ground through capacitors 76 and 77. The collector loads are shunted via capacitor 76 by means of a diode 78 and a capacitor 80. Initially, however, the diode 78 is back biased, in a manner hereinafter to be described, so that the effective collector load is a high impedance represented by the resonant tank, including inductor 72 and capacitor 74 in parallel with tank 75.

Direct current biasing for the transistor Q2 is provided by means of a connection of the battery 42 across voltage-dividing resistors 82 and 84.

The alternating current collector output of transistor Q2 is coupled through a capacitor 86 to the base 88 of transistor Q3, having a collector 90 connected to ground for alternating currents, through capacitor 70 and having an emitter 92 connected to ground through emitter-resistor 94 and capacitor 30. Direct current biasing for transistor Q3 is supplied from the battery 42 across voltage-dividing resistors 95 and 96. Inductor 99 is an alternating current choke.

The emitter-follower output of transistor Q3 is coupled from the emitter-resistor 94 through a capacitor 97, a manual gain control potentiometer 98, and a capacitor 100 to the emitter 102 of transistor Q4 having a base 104 connected to ground for alternating currents through a capacitor 106. The alternating current load for the collector 108 of transistor Q4 comprises a parallel resonant tank 110. The alternating current output is derived from the collector 108 through a coupling capacitor 112. Direct current bias is supplied from the battery 42 across the resistors 114, 116, and 118.

As previously noted, the diodes 34 and 68 are initially forward biased; that is, in the absence of signal and therefore with a large positive automatic gain control voltage, the diodes 34 and 68 are biased into a state of conduction so that the emitter loads of both the transistors Q1 and Q2 are shunted. This means that in the absence of a large signal, the emitter load impedances of transistors Q1 and Q2 are low, and therefore these two transistors operate at high gain. In addition, in the absence of signal and the development of a large positive automatic gain control voltage, the diode 78 is back biased out of conduction, and hence the collector load of transistor Q2 is not shunted. Therefore, under no signal conditions, the collector load of transistor Q2 is at a maximum while the emitter loads of transistors Q1 and Q2 are at a minimum, thereby providing conditions of maximum gain for both stages of the amplifier.

In accordance with the principles of this invention, the diodes 68, 34, and 78 are sequentially controlled in the order named by a source of automatic gain control to first increase the emitter load of transistor Q2 to a maximum, then to increase the emitter load of transistor Q1 to a maximum, and then to decrease the collector load of Q2 to a minimum with an increase in applied signal.

The terminal 120 represents a source of automatic gain control voltage derived from the detector of the receiver, or any other convenient source, and it varies at no signal from a maximum positive direct voltage to a maximum negative voltage with very large signals. The automatic gain control voltage source at terminal 120 is connected to the diode 68 through a zener diode 122 and a resistor 124. The operating characteristics of the various zener diodes are all shown in FIGURE 2. If it is assumed that the zener diode 122 is a 7.5 volt zener, and that the automatic gain control source 20 is at 8.5 volts, the zener diode 122 will be passing current through the resistor 124 to the diode 68. Thus, with minimum signal and hence a maximum gain control voltage at the source 120, the diode 68 will be in a state of conduction, and hence a very low impedance path is provided from the emitter 58 of transistor Q2 through capacitor 66, the diode 68, and the capacitor 70 to ground. This means that the emitter impedance of transistor Q2 is very low, and it will operate at high gain. However, as the signal increases, the voltage at the automatic gain control source 120 decreases. Because of the characteristics of the zener diode 122, the zener will not have a sharp break but will gradually decrease in conduction until the voltage at the source 120 reduces to about 6 volts, at which time the zener diode 122 stops conducting. When the zener diode 122 stops conducting, the diode 68 is cut off and the entire emitter impedance of transistor Q2 as represented by the resonant tank including inductor 60 and capacitor 62 and the resistor 64, shunted by resistor 124 through capacitors 66 and 126, are effectively inserted into the emitter circuit of transistor Q2.

The terminal 120 is also connected to the diode 34 in the emitter circuit of transistor Q1 through a resistor 128, a zener diode 130, and the tank circuit 37. As indicated in FIGURE 2, the characteristics of the zener diode 130 are such that it passes maximum current from the terminal 120 to the diode 34 until such time as the automatic gain control voltage at the terminal 120 decreases to about 2 volts, at which time the zener diode begins to cut off rapidly. While the zener diode 130 is conducting, current flows through the diode 34, thereby establishing the low impedance shunt for the emitter load of transistor Q1. However, as the zener diode cuts off, the emitter impedance of transistor Q1 is increased to the value represented by the resonant tank including the inductor 22 and capacitor 24 and resistor 26 in series with the resistor 28 and in parallel with the tank 37. Thus, when the automatic gain control voltage at terminal 120 decreases to a predetermined value, as determined by the characteristics of the zener diode 130, the first stage transistor Q1 operates with loss since the emitter impedance is greater than the collector impedance.

The automatic gain control voltage at terminal 120 is also connected to the diode 78 through a resistor 132, a zener diode 134, and the tank 75. It will be noted that the diode 78 is poled so that it is back biased except upon the application of a negative current. Thus, until the automatic gain control voltage at terminal 120 goes negative, the diode 78 is non-conductive and the collector load of transistor Q2 is unshunted. However, as the voltage at terminal 120 goes negative, the zener diode 134 conducts, permitting conduction through the diode 78 and thereby shunting the collector load of transistor Q2. As the automatic gain control voltage goes negative, zener diodes 122 and 130 act as regular forward conducting diodes, and thus diodes 68 and 34 are back biased further such that the peak alternating current voltage present across diodes 68 and 34 will not drive them into conduction.

Thus, as seen in FIGURE 3, automatic gain control is exercised in three successive steps. The first control (from 8.5 volts to about 6.5 volts) is exercised by the decreasing conduction of diode 68 to increase the effective emitter impedance of transistor Q2. The second control (from about 2.5 volts to zero volts) is exercised as a result of the decreasing conduction of diode 34 to effectively increase the emitter impedance of transistor Q1. The third control (from zero volt to about −4 volts) is exercised by the increased conduction of diode 78, thereby shunting the collector load of transistor Q2. While FIGURE 3 indicates that the control is not continuous (no additional control being exercised between 6.5 and 2.5 volts), this is a matter of design for a particular application, and the steps in the curve can be eliminated by using zener diodes with different breakdown characteristics and by increasing or decreasing the values of the resistances in series with the zener diodes. By decreasing the gain of Q2 before Q1, a high signal to noise ratio is insured at the input of the amplifier before the amplifier noise figure is deteriorated.

In addition, the circuitry includes a pair of series-conected diodes 136 and 138 connected to the junction of diode 68 and the collector of transistor 3Q for the purpose of temperature compensation, and a pair of diodes 140 and 142 similarly connected to the junction of diode 78 and capacitor 80 are also used for the purpose of temperature compensation.

It will be noted that as the effective emitter impedance of transistor Q1 is increased, due to the decrease in voltage at the automatic gain control source 120, there is a resultant increase in base impedance of that transistor. Since it is desirable to maintain the base input impedance relatively constant, a diode 143 in series with a resistor 144 is connected across the base input circuit through the capacitor 83. The diode 143 is initially biased by means of a fixed direct voltage source at terminal 146 through an inductor 148, a capacitor 150 serving as an alternating current shunt. Dynamic operating bias for the diode 143 is supplied from the terminal 120 through a resistor 152 and resistor 144. The diode 143 is poled so that as the voltage at terminal 120 decreases to the point where the emitter impedance of transistor Q1 is increased by the reduced conduction of diode 34, increased conduction results through diode 143, thereby tending to reduce the impedance at the base input of transistor Q1 and maintaining it relatively constant.

Thus there has been disclosed a system of automatic gain control in which multiple stages are successively controlled while maintaining the quiescent direct current operating levels and impedances relatively constant. This system results in low modulation distortion since at high input levels a high impedance is inserted in the emitter circuits of the transistor amplifiers, thereby keeping the alternating current swing less than the quiescent direct currents.

While the particular parameters used are a matter of design for the particular application, the parameters used in a multistage amplifier actually reduced to practice are as follows.

Transistors:

| | | |
|---|---|---|
| Q1 | | Type 118N2 |
| Q2 | | Type 118N2 |
| Q3 | | Type 118N2 |
| Q4 | | Type 118N2 |

Resistors:

| | | |
|---|---|---|
| **26** | ohms | 56K |
| **28** | do | 2.7K |
| **50** | do | 18K |
| **52** | do | 22K |
| **64** | do | 2.7K |
| **81** | do | 18K |
| **82** | do | 18K |
| **84** | do | 15K |
| **94** | do | 2.7K |
| **95** | do | 15K |
| **96** | do | 15K |
| **98** | ohms potentiometer | 2K |
| **114** | ohms | 2.7K |
| **116** | do | 22K |
| **118** | do | 18K |
| **124** | do | 22K |
| **128** | do | 8.2K |
| **132** | do | 3K |
| **144** | do | 1.2K |
| **152** | do | 15K |

Inductors:

| | | |
|---|---|---|
| **12** | μh | 470 |
| **22** | μh | 1000 |
| **33** | μh | 1000 |
| **38** | μh | 1000 |
| **46** | μh | 1000 |
| **60** | μh | 1000 |
| **71** | μh | 1000 |
| **72** | μh | 1000 |
| **99** | μh | 1000 |
| **148** | μh | 1000 |

Capacitors:

| | | |
|---|---|---|
| **14** | pf | 100 |
| **16** | μf | .33 |
| **24** | pf | 56 |
| **30** | μf | .33 |
| **32** | μf | .47 |
| **35** | pf | 56 |
| **36** | μf | .33 |
| **39** | μf | .33 |
| **40** | pf | 39 |
| **48** | μf | .33 |
| **54** | μf | .33 |
| **62** | pf | 56 |
| **66** | μf | .47 |
| **70** | μf | .33 |
| **73** | pf | 33 |
| **74** | pf | 47 |
| **76** | μf | .33 |
| **77** | μf | .33 |
| **80** | μf | .01 |
| **83** | μf | .01 |
| **86** | μf | .33 |
| **97** | μf | .33 |
| **100** | μf | .33 |
| **106** | μf | .33 |
| **112** | μf | .33 |
| **126** | μf | .33 |
| **150** | μf | .01 |

Diodes:

| | |
|---|---|
| **34** | Type AM620A |
| **44** | Type 1N270 |
| **68** | Type AM620A |
| **78** | Type AM620A |
| **136** | Type 1N270 |
| **138** | Type 1N270 |
| **140** | Type 1N270 |
| **142** | Type 1N270 |
| **143** | Type AM620A |

Zener diodes:

| | |
|---|---|
| **122**, 7.5 volts | Type 1N755A |
| **130**, 2.8 volts | Type 1N3477A |
| **134**, 2.8 volts | Type 1N3477A |

| Battery: | | |
|---|---|---|
| 42 | volts | −5 |
| At terminal 146 | do | +10 |
| Tank 110 | | (1) |

[1] Tuned to 700 kc.

It will be apparent that this invention is subject to various modifications and adaptations. For example, the zener diodes may be replaced by the diode junctions of transistors which are controlled by signal level so as to render the various diodes conductive or non-conductive in accordance with a desired program. Furthermore, gain control may be exercised in additional stages or the sequence may be varied to suit a particular application. It is, therefore, intended that this invention be limited only by the scope of the appended claims as interpreted in the light of the prior art.

What is claimed is:

1. An alternating current signal amplifier comprising:

a transistor having at least first and second variable impedance alternating current loads, said first variable alternating current load impedance being an emitter load, and said second variable impedance alternating current load being a collector load;

a source of direct current for quiescently biasing said transistor;

a source of automatic gain control voltage having a level proportional to signal;

and means responsive to predetermined levels of said source of automatic gain control voltage for successively varying the impedance of said emitter load and said collector load in the order named for decreasing the gain of said amplifier in response to increased signals.

2. The invention as defined in claim 1 wherein said emitter load includes a first semiconductor diode forward biased to provide a low impedance in the absence of signal, and wherein said collector load includes a second semiconductor diode back biased to provide a high impedance in the absence of signal, the bias on said first and second semiconductor diodes being reversed in response to predetermined levels of said source of automatic gain control voltage resulting from increased signal.

3. The invention as defined in claim 2 wherein said source of automatic gain control voltage level varies from a maximum voltage level of one polarity in the absence of signal to a maximum voltage level of opposite polarity with increased signal; and first and second zener diodes, said first and second semiconductor diodes being connected in series with said first and second zener diodes, respectively, and said source of automatic gain control voltage, said semiconductor diodes being oppositely poled with respect to said source of automatic gain control voltage, said first zener diode being back biased beyond its zener breakdown region whereby current flows through said first zener diode to forward bias said first semiconductor diode until said source of automatic gain control voltage is reduced below the zener breakdown region of said first zener diode, said second zener diode being forward biased by said source of automatic gain control voltage to back bias said second semiconductor diode until the polarity of said source of automatic gain control voltage changes and the level thereof exceeds the zener breakdown region of said second zener diode to forward bias said semiconductor diode.

4. A multistage alternating current signal amplifier comprising:

a first and a second transistor cascaded for alternating current signal amplification, each of said transistors having a variable impedance alternating current emitter load, said variable impedance emitter loads of said first and second transistors, respectively, each comprising a semiconductor diode forward biased by said source of automatic gain control voltage;

a source of direct currents for quiescently biasing said transistors;

a source of automatic gain control voltage having a level proportional to signal;

and means responsive to predetermined levels of said source of automatic gain control voltage for successively increasing the impedance of said second emitter load and the impedance of said first emitter load in the order named, whereby the gain of said second transistor is reduced prior to the gain of said first transistor in response to increased signal level.

5. The invention as defined in claim 4 wherein first and second zener diodes are connected in series with said first and second semiconductor diodes, respectively, and said source of automatic gain control voltage, each of said zener diodes being back biased beyond its zener breakdown region, whereby current flows through each of said zener diodes and each of said semiconductor diodes to forward bias each of said semiconductor diodes, and wherein said source of automatic gain control voltage decreases with an increased signal below said zener breakdown regions, whereby said forward bias is removed from each of said semiconductor diodes, said second zener diode having a higher zener breakdown region than said first zener diode.

6. The invention as defined in claim 4, and a resistor in series with each of said zener diodes.

7. A multistage alternating current signal amplifier comprising:

a first and a second transistor cascaded for alternating current signal amplification, each of said transistors having a respective high impedance alternating current collector load and a respective low impedance alternating current emitter load;

a source of direct current for quiescently biasing said transistors;

a source of automatic gain control voltage having a level proportional to signal;

and means responsive to predetermined levels of said source of automatic gain control voltage for successively increasing the emitter load impedance of said second transistor and said first transistor, and decreasing the collector load impedance of said second transistor, whereby the gain of said amplifier is reduced in response to increased signal level.

8. The invention as defined in claim 7 wherein each of said respective alternating current emitter loads of said first and second transistors and said alternating current collector load of said second transistor comprises a relatively high impedance in parallel with a semiconductor diode, each of said diodes in parallel with said emitter loads being forward biased in the absence of signal, and said diode in parallel with said collector load being back biased in the absence of signal, the gain control voltage resulting from increased signal successively reversing the bias on said diodes to decrease gain of said amplifier with increased signal.

9. The invention as defined in claim 8 wherein said source of automatic gain control voltage varies from a maximum voltage of one polarity in the absence of signal to a maximum voltage of the opposite polarity with increases in signal, and wherein each of said semiconductor diodes is connected in series with a respective zener diode and in series with said source of automatic gain control voltage, said zener diodes in series with said diodes in parallel with said emitter loads being reversely biased beyond their respective zener breakdown regions in the absence of signal whereby current flows therethrough to forwardly bias the respective semiconductor diodes, and whereby said zener diode in series with said diode in parallel with said collector load is forward biased by said source of automatic gain control voltage in the absence of signal to back bias to respective semiconductor diode until its zener breakdown region is exceeded.

10. The invention as defined in claim 9, and a resistor in series with each of said zener diodes.

11. In a system for automatically controlling the gain of a multistage alternating current signal amplifier from a source of direct gain control voltage, the combination comprising:

a first and a second stage, each stage including a transistor having a base, an emitter and a collector, each of said emitters being connected to a point of reference potential through a respective high impedance alternating current emitter load, the collector of said second stage transistor being connected to said point through a high impedance alternating current collector load, said signal being applied between the base of said first stage transistor and said point, the collector of said first stage transistor being coupled to the base of said second stage transistor;

a source of direct voltage biasing potential quiescently biasing said transistors;

first and second low impedance alternating current emitter loads normally connected across the high impedance emitter loads of the transistors in said first and second stages, respectively;

a low impedance alternating current collector load, said low impedance collector load being normally disconnected;

and control means for each of said low impedance alternating currents for disconnecting said low impedance alternating current loads and for connecting said low impedance collector load across said high impedance collector load in response to the level of said source of direct current gain control voltage, each of said control means being responsive to a different level of said source of direct current gain control voltage.

12. The invention as defined in claim 11 wherein each of said control means comprises a semiconductor diode, said semiconductor diode being connected in series with a respective low impedance load, said semiconductor diodes in series with said low impedance alternating current emitter loads being forward biased in the absence of signal, and said semiconductor diode in series with said low impedance alternating current collector load being back biased in the absence of signal, and means for reversing the bias on each of said diodes in response to predetermined levels of said source of direct current automatic gain control voltage.

13. The invention as defined in claim 12, and a zener diode for each of said semiconductor diodes, each of said zener diodes being connected in series with said source of direct current automatic gain control voltage and a respective diode, said zener diodes having different breakdown characteristics, whereby the bias on said diodes is reversed at different levels of said source of direct voltage automatic gain control voltage.

14. The invention as defined in claim 13, and a semiconductor diode connected between the base of said first stage transistor and said point, said source of automatic gain control voltage being connected to said diode to control the level of back bias of said diode.

References Cited

UNITED STATES PATENTS

| | | | |
|---|---|---|---|
| 3,032,704 | 5/1962 | Beck | 330—29 X |
| 3,193,767 | 7/1965 | Schultz | 325—410 |

ROY LAKE, *Primary Examiner.*

J. B. MULLINS, *Assistant Examiner.*